(12) United States Patent
Takegoshi et al.

(10) Patent No.: US 8,441,260 B2
(45) Date of Patent: May 14, 2013

(54) TRANSMIT-RECEIVE SWITCHING CIRCUIT FOR NMR SPECTROMETER AND NMR SPECTROMETER INCORPORATING SAME

(75) Inventors: Kiyonori Takegoshi, Kyoto (JP); Takashi Mizuno, Kyoto (JP)

(73) Assignees: JEOL Resonance Inc., Tokyo (JP); Kyoto University, Kyoto-shi (JP)

( * ) Notice: Subject to any disclaimer, the term of this patent is extended or adjusted under 35 U.S.C. 154(b) by 301 days.

(21) Appl. No.: 13/121,763

(22) PCT Filed: Oct. 8, 2009

(86) PCT No.: PCT/JP2009/067551
§ 371 (c)(1),
(2), (4) Date: Mar. 30, 2011

(87) PCT Pub. No.: WO2010/041712
PCT Pub. Date: Apr. 15, 2010

(65) Prior Publication Data
US 2011/0187371 A1    Aug. 4, 2011

(30) Foreign Application Priority Data
Oct. 8, 2008  (JP) .................................. 2008-261498

(51) Int. Cl.
*G01V 3/00* (2006.01)
(52) U.S. Cl.
USPC .......................................... 324/322; 324/318
(58) Field of Classification Search .......... 324/300–322; 600/407–445
See application file for complete search history.

(56) References Cited

U.S. PATENT DOCUMENTS

| 7,282,919 B2 | 10/2007 | Doty et al. |
| 7,800,368 B2 * | 9/2010 | Vaughan et al. ............... 324/318 |
| 2012/0037887 A1 * | 2/2012 | Tian et al. ....................... 257/21 |

FOREIGN PATENT DOCUMENTS

| JP | 59171842 A | 9/1984 |
| JP | 648446 Y2 | 12/1994 |
| JP | 2008128943 A | 6/2008 |
| JP | 2009216578 A | 9/2009 |

OTHER PUBLICATIONS

Vaughan et al., "A Simple, Low Power, Multiple Pulse NMR Spectrometer", The Review of Scientific Instruments, Sep. 1972, pp. 1356-1364, vol. 43, No. 9.
Lengeler, "Semiconductor Devices Suitable for Use in Cryogenic Environments", Cryogenics, Aug. 1974, pp. 439-447, vol. 14, No. 8.
Rinard et al., "A Cryogenically Coolable Microwave Limiter", Journal of Magnetic Resonance, 1999, pp. 207-210, vol. 136.

* cited by examiner

*Primary Examiner* — Brij Shrivastav
(74) *Attorney, Agent, or Firm* — The Webb Law Firm

(57) ABSTRACT

A transmit-receive switching circuit is offered which is for use in an NMR spectrometer that employs a solid-state NMR probe using a cooled detection coil. The switching circuit is cryogenically cooled to reduce thermal noise in use. The switching circuit has a first terminal for applying high-power RF pulses sent in from the power amplifier of the NMR spectrometer, a second terminal for sending the RF pulses applied from the first terminal to the NMR detector via crossed-diodes and for receiving and entering a low-power NMR signal detected by the NMR detector, and a third terminal for sending the NMR signal entered from the second terminal toward a preamplifier. Plural stages of shunts are connected to the transmission line connecting the second and third terminals such that one stage of shunt corresponds to a 90° phase shift in the RF radiation.

10 Claims, 6 Drawing Sheets

TRANSMIT-RECEIVE SWITCHING CIRCUIT FOR NMR SPECTROMETER AND NMR SPECTROMETER INCORPORATING SAME

FIELD OF THE INVENTION

The present invention relates to a transmit-receive switching circuit used in a nuclear magnetic resonance (NMR) spectrometer and also to the NMR spectrometer incorporating the transmit-receive switching circuit. More particularly, the invention relates to a low-noise, transmit-receive switching circuit used in a solid-state NMR spectrometer using a cooled detection coil and to the NMR spectrometer incorporating the transmit-receive switching circuit.

DESCRIPTION OF THE RELATED ART

An NMR spectrometer is an instrument for analyzing the molecular structure of a sample under investigation by placing the sample in a static magnetic field, irradiating the sample with RF pulses having an NMR frequency, detecting a feeble RF signal (NMR signal) emanating from the sample, and extracting information about the molecular structure contained in the detected signal.

FIG. 1 schematically shows the structure of an NMR spectrometer. This instrument has an RF oscillator 1 producing an RF signal, which is controlled in terms of phase and amplitude (pulse width) by a phase controller 2 and an amplitude controller 3 and sent as RF pulses to a power amplifier 4.

The power amplifier 4 amplifies the RF pulses to a power level necessary to excite an NMR signal. The RF pulses from the amplifier 4 are sent via a duplexer 5 to an NMR probe 6 in which a detection coil (not shown) is placed. The detection coil directs the RF pulses to a sample under investigation.

After the application of the RF pulses, a feeble NMR signal emanating from the sample is detected by the detection coil. The signal is passed through the duplexer 5 and then fed to a preamplifier 7, which in turn amplifies the signal to a level at which the signal can be treated by a receiver 8.

The receiver 8 converts the frequency of the RF NMR signal amplified by the preamplifier 7 to an audio frequency at which the signal can be converted into digital form. Simultaneously, the receiver 8 controls the amplitude. The audio NMR signal from the receiver 8 is converted into digital form by an analog-to-digital data converter 9 and fed to a control computer 10.

The control computer 10 controls the phase controller 2 and amplitude controller 3, Fourier-transforms the NMR signal accepted in the time domain, corrects the phase of the Fourier-transformed NMR signal, and then displays the NMR signal as an NMR spectrum.

This NMR spectrometer has a transmit mode in which RF pulses are sent to the NMR probe 6 and a receive mode in which feeble NMR signals detected by the probe 6 are sent to the receiver 8 via the preamplifier 7. The mode of operation is switched between the transit and receive modes by the duplexer 5.

Generally, two types are known as the duplexer 5. In one type, the duplexer switches the mode of operation between the transit mode and the receive mode according to a switching signal produced from a switching circuit 11 (as made of an operational amplifier) based on a control signal delivered from the computer 10. In the other type, the duplexer automatically switches the mode of operation between the transit and receive modes using crossed-diodes as disclosed in Patent Document 1.

FIG. 2 shows one example of conventional duplexer for switching the mode of operation between the transmit and receive modes using crossed-diodes.

In this circuit, during transmission of RF pulses, RF currents are dissipated to ground by a coaxial cable 12 and a pair of crossed-diodes 13 connected in opposite senses. The cable 12 has a length equivalent to a quarter ($\lambda/4$) of the wavelength $\lambda$ of the RF pulses. The outer conductor of the cable 12 is grounded. Thus, RF leakage to the receiver 8 is prevented. During reception of NMR signals, insulative nature of crossed-diodes 14 prevents the NMR signals from going toward the power amplifier 4.

Specifically, the crossed-diodes do not pass low-voltage signals lower than a given bias voltage but pass only high-voltage signals higher than the given bias voltage. That is, when a large electric power is applied to the crossed-diodes, they are turned ON, thus conducting electricity. When a small electric power is applied, they remain OFF, thus not conducting electricity. In this way, electrical insulation is employed.

That is, if the cable 12 having a length of $\lambda/4$ is used, the impedance at the end a on the detector side is maximal. The impedance at the end b on the side of the receiver 8 is minimal. Accordingly, if RF pulses of high electric power delivered from the power amplifier 4 are applied to the detector, the crossed-diodes 14 are automatically conducted (turned ON). RF leakage current that is maximal at the end b on the side of the receiver 8 automatically conducts the crossed-diodes 13, so that the current flows into earth ground. Consequently, no leakage current of RF pulses flows toward the receiver 8. Hence, the receiver 8 is protected from high electric power.

When a very weak NMR signal is produced from the detector, the crossed-diodes 14 and 13 remain insulative (kept OFF) and so no current flows toward the power amplifier 4 or toward earth ground. The NMR signal is fully transmitted toward the receiver 8.

[Patent document 1] JP-A-59-171842
[Patent document 2] U.S. Pat. No. 7,282,919
[Non-patent document 1] R. W. Vaughan et al., Review of Scientific Instruments, Vol. 43, pp. 1356-1364.

DISCLOSURE OF THE INVENTION

Problems to be Solved by the Invention

Where such a duplexer is used in a solid-state NMR spectrometer using a cooled detection coil, the following problems take place.

The first problem is that any duplexer operating at low temperatures is not available. That is, where the dielectric coupling to the sample is neglected, an equation regarding the S/N of an NMR spectrum is given by $$\frac{V_S}{V_N} = M_0 \sin\theta_m \sqrt{\frac{Q_c \mu_0 \eta_f v_s \omega_0}{4 k_B (T_c + T_a) \Delta f}} \quad (1)$$

where $V_S$ (in volts) is a parameter indicating the electromotive force of an NMR signal arising from detected nuclear spins, $V_N$ is a parameter (in volts) indicating the sum of noise electromotive forces produced from sections starting with the detection coil and ending with the output of the preamplifier, $M_0$ is a parameter indicating the thermally equilibrated magnetization of the nuclear spins in the static magnetic field, $\theta_m$ is a parameter indicating the angle made between the oscillatory magnetic field created by the detection coil and the static magnetic field, $\mu_0$ is a parameter indicating the space permeability, $v_s$ is a parameter indicating the volume of the sample, $\omega_0$ is a parameter indicating the Larmor frequency of the nuclear spins in the static magnetic field, $k_B$ is a parameter indicating the Boltzmann constant, $\Delta f$ is a parameter indicating the observation bandwidth, $Q_c$ is a parameter indicating the Q value of the detection coil, $\eta_f$ is a parameter indicating the filling factor which is in principle the ratio of the magnetic field strength in the sample space to the whole magnetic field strength felt by the coil (in the case of a solenoid coil, it is simply given by the ratio of the volume of the sample to the cylindrical volume inside the coil), $T_c$ is a parameter indicating the temperature of the conductor forming the detection coil, and $T_a$ is a parameter indicating the noise temperature of the preamplifier.

A magic angle spinning (MAS) probe has a detection portion that is cooled cryogenically to reduce thermal noise. The sample is spun at a high speed (about at 8 kHz according to the existing technique) while controlling the sample within a temperature range of from room temperature to a desired temperature. A magnetization detection coil acting also as an RF pulse transmitter coil is placed in a cryogenic environment (below about 20 K in the existing technique). As a result, thermal noise arising from the conductor of the detection coil and depending on the temperature $T_c$ of the conductor is reduced. The electrical resistance of the conductor itself of the detection coil depending on the temperature $T_c$ of the conductor is also reduced, thus reducing the radio-frequency resistance. As a consequence, the Q (Qc) of the coil is improved. It is attempted to improve the sensitivity of the NMR spectrum obtained from the sample placed at room temperature by the above-described improvements.

Where small signals are detected as in high-resolution NMR spectroscopy, a preamplifier needs to be placed ahead of the receiver to obtain sufficient signal sensitivity for an A/D converter. If the gain of this preamplifier is sufficiently large, added noises originating from a rear stage of amplifier can be almost neglected. Accordingly, it is generally considered that noise included in NMR signals arises from the following three factors:

(1) Thermal noise arising from the detection coil (originating from $T_c$)

(2) Insertion loss occurring from the section (including a duplexer) beginning with the detection coil and ending with the preamplifier (3) Noise figure of the preamplifier (associated with $T_a$)

It is convenient to represent the magnitude of noise by converting it into noise temperature because the noise temperature of the whole system is the sum of the noise temperatures obtained by converting the magnitudes of insertion loss-induced and additive noises in individual elements. Therefore, great noise reduction cannot be achieved if only one of these three factors is reduced. A decrease in the noise temperature of the whole system must be achieved at the same time.

However, Si diodes (such as 1S955) conventionally used as devices in duplexers for solid-state NMR cannot perform rectification because minority carriers disappear below about 50 K and hence the function of the duplexers is not served (see B. Lengeler, Cryogenics, Vol. 14(8), 439-447 (1974)).

To avoid this disadvantage, it is conceivable to place a duplexer in a relatively high-temperature region of above 50 K. In practice, such measure has been taken in conventional solution probes using a cooled detection coil. When the installation temperature of the coil and preamplifier is lowered in an attempt to improve the sensitivity further, this method presents the following two problems.

(1) The insertion loss of the duplexer placed in a relatively hot region becomes so large that it can no longer be neglected compared with overall noise.

(2) The limit of the installation temperature of the coil and preamplifier is determined by inflow of heat from the instrumental portion where the duplexer is mounted.

For the reasons cited above, it is desired for an instrument designed to improve the sensitivity by similar strategies (i.e., (1) a common circuit is used for both transmission and reception and (2) a signal switching circuit is included) as well as for a MAS probe using a cooled detection coil to operate a duplexer located midway between the detection coil and the preamplifier at a temperature made as low as possible.

The second problem is that it is impossible to protect the input of the preamplifier (especially, one consisting of HEMTs (high electron mobility transistors) from RF leaking power of high output pulses with crossed-diodes alone.

In solid-state NMR spectroscopy, high-output pulses are often used to excite or deliver broadband spectra. In order to obtain low-noise characteristics at low temperature over a wide range, it is useful to use HEMTs of GaAs/AlGaAs.

However, an amplifier made up of such HEMTs are more vulnerable to high-input voltages than Si-based amplifiers used in normal NMR spectrometers. Therefore, the preamplifier of the duplexer needs to have capabilities of protecting it against large signals. In spite of this, protecting devices (especially, diodes) have the fatal disadvantage that their operating resistance is high in reducing signals sufficiently. This creates the problem that it is very difficult to use HEMTs.

It is a first object of the present invention to develop a duplexer which makes use of GaAs diodes and is operated at low temperatures in view of the first problem. That is, GaAs semiconductors perform rectification by majority carriers unlike Si-based semiconductors as made chiefly of Si or Ge. Therefore, if the GaAs semiconductors are placed at low temperatures, the semiconductors are hardly affected by a decrease in the number of Cooper pairs and can be used even at 4 K (above-cited document (B. Lengeler) and G. A. Rinard et al., J. Magn. Reson. Vol. 136, 207-210 (1999)).

It is a second object of the invention to provide means for protecting a low-noise preamplifier operated at low temperatures and using HEMT devices against high input signals by making use of an RF-MEMS (radio-frequency microelectromechanical system) switch in view of the second problem. That is, it is reported that the upper limit of the input to HEMT devices included in a low-noise amplifier is about 0 dBm (experimental value). Pulses showing transient response must not exceed the upper limit even momentarily. Therefore, the upper limit is preferably below −10 dBm that is lower than the upper limit value specified by the manufacturer by one order of magnitude.

Stationary waves of leaking power are produced in the stage following the crossed-diodes and so further crossed-diodes are installed at the position of ¼ wavelength at which the amplitude of the electric power is maximal. Consequently, electric power can be reduced further.

However, PIN diodes fabricated from GaAs have large forward voltages. That is, during operation, the resistivities are large. Therefore, relatively large electric power is necessary to bring GaAs PIN diodes into conduction. If crossed-diodes are used alone, it is difficult to reduce leaking electric power sufficiently to protect HEMT devices.

Although GaAs Schottky diodes are lower in forward voltage than GaAs PIN diodes, the currently achieved lower limit of electric power capable of bringing GaAs Schottky diodes into conduction is about 13 to 15 dBm (experimental values) in the case of the zero-biased crossed diode configuration.

We have devised utilization of an RF-REMS switch to reduce electric power further in a region of powers lower than the lower limit of electric power that can be cut off with GaAs diodes. The RF-MEMS switch is much smaller in resistivity than GaAs diodes. The RF-MEMS switch brings a conductor into direct contact. Therefore, electric power can be reduced even if the power is at low level. However, the RF-MEMS switch is not well suited for transmission of large electric power. Therefore, the switch can be used stably by placing it in a stage following GaAs crossed-diodes.

RF-MEMS switches have been researched, especially earnestly by OMRON Corporation, Japan. In recent years, the number of operations that can be performed by the switches (i.e., ruggedness) has exceeded 100 millions and thus they can be put into practical use (see URL: http://www.omron-.co.jp/ecb/products/rf/). It has been experimentally confirmed that the RF-MEMS can operate at cryogenic temperatures of above 17 K. A shunt circuit fabricated from an RF-MEMS can effectively reduce electric power even at values of power at which diodes do not operate.

If these two solutions are combined, it is possible to offer a low-noise, transmit-receive switching circuit preferably used in a solid-state NMR spectrometer using a cooled detection coil.

Means for Solving the Problem

It is an object of the present invention to provide this low-noise, transmit-receive switching circuit adapted for use in a solid-state NMR spectrometer cooled during use to reduce thermal noise. The switching circuit has: a first terminal to which RF pulses of high electric power for observation are applied; a second terminal connected with an NMR detector which applies the RF pulses to a sample and which detects an NMR signal emanating from the sample; a third terminal for delivering the NMR signal to an external receiver circuit; crossed-diodes permitting the RF pulses applied from the first terminal to be supplied to the second terminal; a first transmission line through which the NMR signal applied from the second terminal is transmitted to the third terminal; a second transmission line through which the NMR signal applied from the second terminal is transmitted to the third terminal; plural stages of phase shifters connected in series and inserted in the transmission lines; and shunts inserted between their respective output terminals of the phase shifters and earth ground. The phase shifters shift the phase of the RF pulses by an angle (90°+180°×n) (where n is 0 or a natural number). Where the RF pulses for observation are applied to the first terminal, the crossed-diodes are electrically connected with the shunts. Under this condition, the RF pulses are supplied from the first terminal to the NMR detector via the second terminal. Where the NMR signal is entered from the second terminal after the application of the RF pulses, the crossed-diodes are electrically disconnected from the shunts. Under this condition, the NMR signal is transmitted from the second terminal to the third terminal.

In one feature of the switching circuit, the plural stages of phase shifters are three stages of phase shifters connected in series. First crossed-diodes, second crossed-diodes, and an RF-MEMS switch are arranged as the shunts in this order. The first crossed-diodes are made of GaAs PIN diodes. The second crossed-diodes are made of GaAs Schottky barrier diodes. The RF-MEMS switch is so controlled that when the RF pulses for observation are being applied to the first terminal, the switch is turned on and that when the NMR signal is entered from the second terminal after the application of the RF pulses, the switch is turned off.

The present invention also provides a solid-state NMR spectrometer using a cooled detection coil and incorporating the transmit-receive switching circuit described in the immediately preceding paragraph.

Effect of the Invention

The transmit-receive switching circuit associated with the present invention is for use in a solid-state NMR spectrometer cooled during use to reduce thermal noise. The switching circuit has: a first terminal to which RF pulses of high electric power for observation are applied; a second terminal connected with an NMR detector which applies the RF pulses to a sample and which detects an NMR signal emanating from the sample; a third terminal for delivering the NMR signal to an external receiver circuit; crossed-diodes permitting the RF pulses applied from the first terminal to be supplied to the second terminal; a first transmission line through which the NMR signal applied from the second terminal is transmitted to the third terminal; a second transmission line through which the NMR signal applied from the second terminal is transmitted to the third terminal; plural stages of phase shifters connected in series and inserted in the transmission lines; and shunts inserted between their respective output terminals of the phase shifters and earth ground. The phase shifters shift the phase of the RF pulses by an angle (90°+180°×n) (where n is 0 or a natural number). Where the RF pulses for observation are applied to the first terminal, the crossed-diodes are electrically connected with the shunts. Under this condition, the RF pulses are supplied from the first terminal to the NMR detector via the second terminal. Where the NMR signal is applied from the second terminal after the application of the RF pulses, the crossed-diodes are disconnected from the shunts. Under this condition, the NMR signal is transmitted from the second terminal to the third terminal. Consequently, a transmit-receive switching circuit adapted for use in a solid-state NMR probe using a cooled detection coil within an NMR spectrometer can be offered.

Other features and advantages of the present invention will become apparent from the following more detailed description, taken in conjunction with the accompanying drawings, which illustrate, by way of example, the principles of the invention.

DETAILED DESCRIPTION OF THE INVENTION

Figure 1:
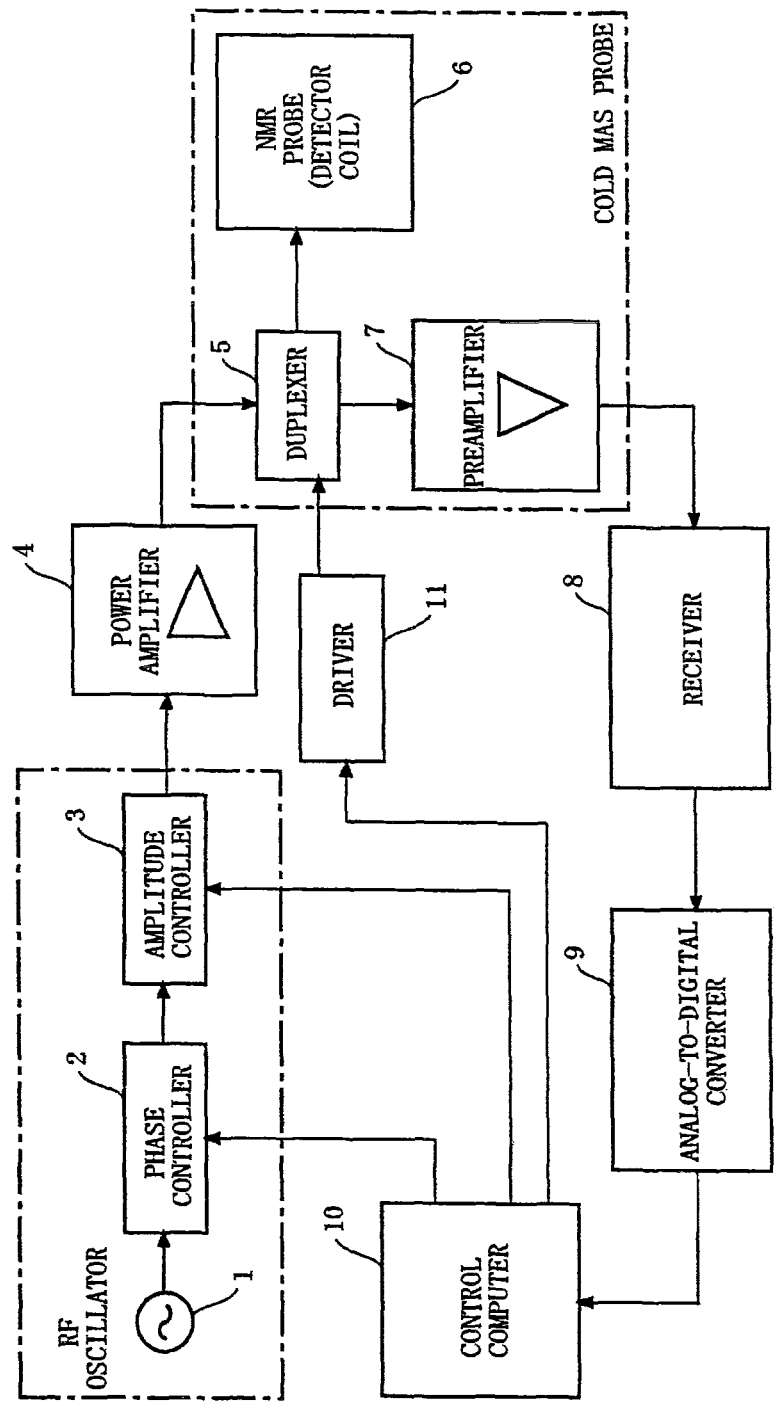
FIG. 1 is a block diagram of a conventional NMR spectrometer, showing its configuration.

An NMR spectrometer into which a transmit-receive switching circuit associated with the present invention is incorporated is fundamentally identical with the conventional NMR spectrometer shown in FIG. 1. Usually, an NMR probe, a duplexer, and a preamplifier are separate units. In a MAS probe using a cooled detection coil, these three units need to be mounted in one housing and cooled.

Embodiment 1

Figure 3:
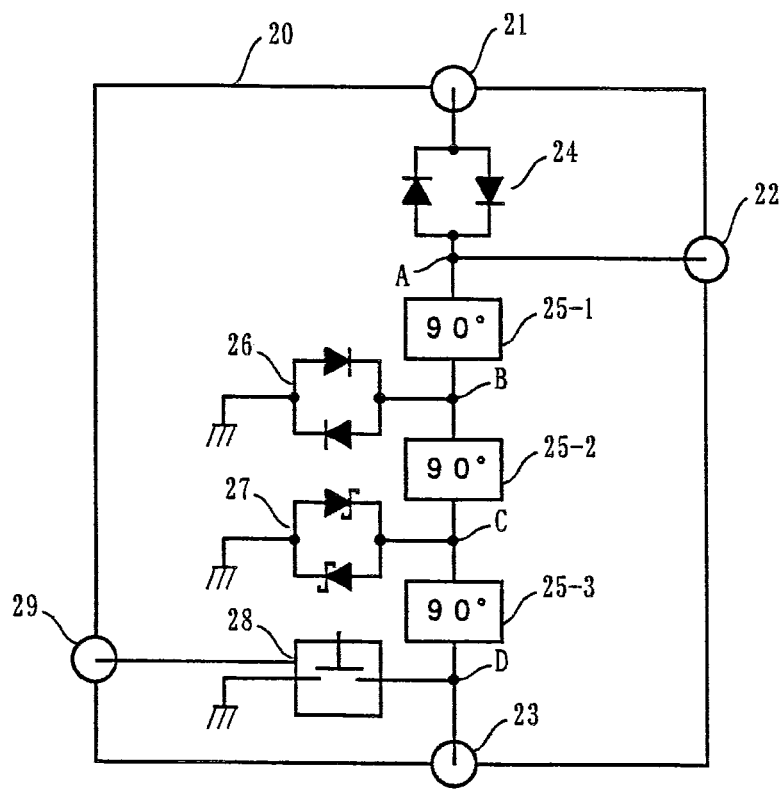
FIG. 3 is a circuit diagram of a cooled duplexer according to one embodiment of the present invention.

FIG. 3 shows a transmit-receive switching circuit according to one embodiment of the present invention, the switching circuit being for use in an NMR spectrometer. The switching circuit includes a duplexer adapted to be operated at low temperatures. In FIG. 3, the switching circuit has a circuit board 20 that is cooled to a temperature of about 45 K, together with devices mounted on the circuit board, by a cooling mechanism (described later).

The circuit board 20 has an input terminal 21 to which RF pulses are applied from a power amplifier, an input/output terminal 22 connected with an NMR probe, an output terminal 23 for outputting an NMR signal to a preamplifier, and an input terminal 29 to which a switch-driving signal is applied. A pair of crossed-diodes 24 is connected in series with a transmission line segment extending from the input terminal 21.

The crossed-diode pair 24 has an output end A connected with the input/output terminal 22. A crossed-diode pair shunt 26 made of GaAs PIN diodes is inserted between a transmission line segment and earth ground and connected with an end B of the transmission line segment that is connected with the end A via a 90° phase shifter 25-1. The phase shifter 25-1 may often be replaced by an LC resonance circuit or a quarter-wavelength coaxial cable.

Another crossed-diode pair shunt 27 made of GaAs Schottky barrier diodes is connected with an end C of a transmission line segment, which in turn is connected with the output end B via a 90° phase shifter 25-2.

A shunt RF-MEMS switch 28 is connected with an end D of a transmission line segment, which in turn is connected with the end C via a 90° phase shifter 25-3. The end D is also connected with the output terminal 23, which in turn is connected with the preamplifier.

An RF-MEMS switch activation terminal 29 is connected with the RF-MEMS switch 28.

Instead of the above-described 90° phase shifters, phase shifters (such as 270° phase shifters or 450° phase shifters) for shifting the phase of RF radiation by an angle given by 90°+180°×n (where n is a natural number) may be used.

In the present embodiment, the three shunts 26, 27, and 28 are arranged from the input/output terminal 21 toward the input/output terminal 23. The shunt located closest to the first terminal has maximum capability in withstanding high inputs. The shunt located closest to the third terminal has minimum leaking electric power.

Figure 2:
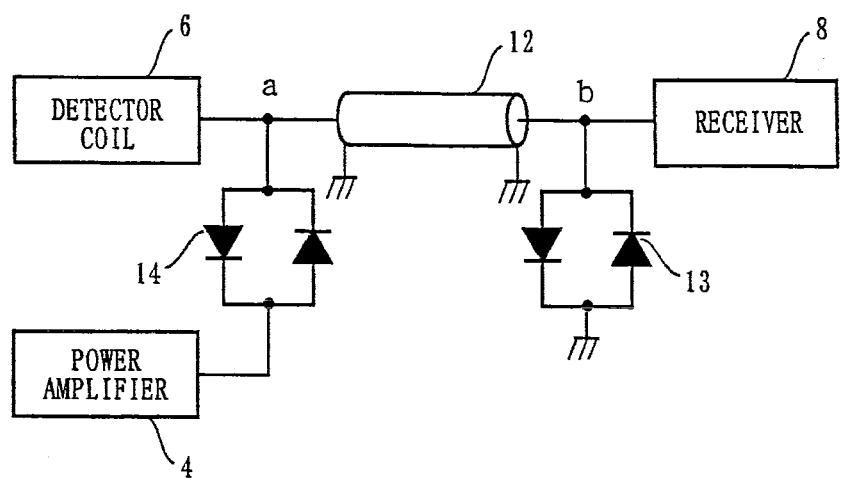
FIG. 2 is a circuit diagram of one conventional duplexer.
Figure 4:
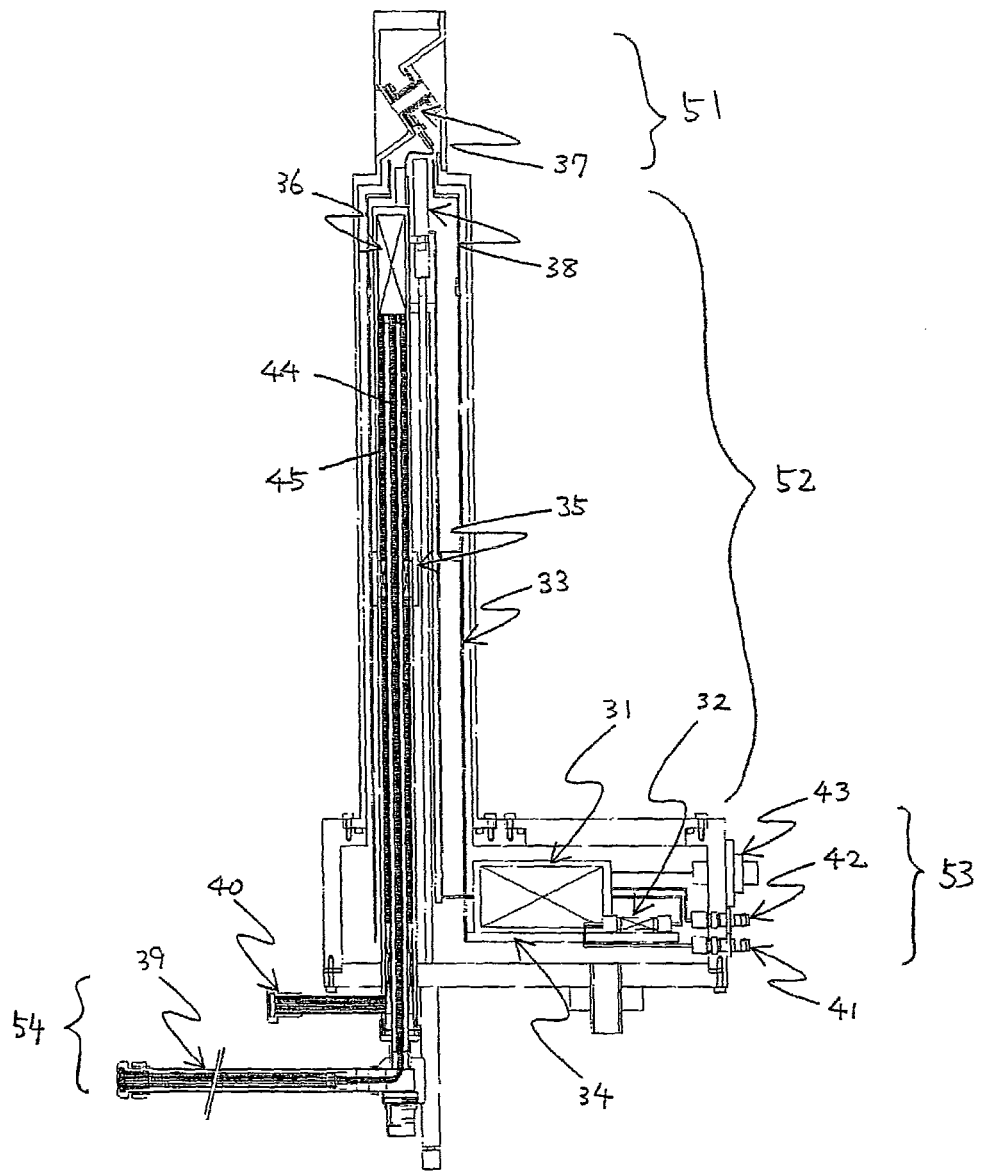
FIG. 4 is a vertical cross section of a solid-state NMR probe using a cooled detection coil, the probe incorporating the cooled duplexer associated with the invention.

FIG. 4 shows a cross section (mechanical design drawing) of one example of the MAS probe using a cooled detection coil. A duplexer 31 (the same as the duplexer shown in FIG. 2) used in a low-temperature environment and a preamplifier 32 are located in a lower portion of the probe, and are placed on a cold stage 34 that is in thermal contact with a radiation shield 33.

Accordingly, in this location, the duplexer 31 operating at low temperatures and preamplifier 32 can be used while hardly affected by strong static magnetic field. The cold stage 34 is made of a metal having a high thermal conductivity such as aluminum or copper. In use, the cold stage 34 is kept substantially at the same temperature of about 50 K as the radiation shield 33.

The operative temperature of the duplexer 31 for use in a low-temperature environment and of the preamplifier 32 is determined based on the balance between the cooling capabilities of a second heat exchanger 35 and the amount of heat flowing in from the outside (conductive heat arising from the coaxial cable and radiation heat). It has been experimentally found that the operative temperature is 45 K when the flow rate of liquid helium is 3 to 4 liters/hour.

The inventive MAS probe using a cooled detection coil consists of four major parts: detection portion 51, relay portion 52, electric circuit portion 53, and refrigerant inlet/outlet portion 54. A transmit-receive coil 37 is placed in the detection portion 51. The coil 37 applies an RF magnetic field to a solid sample held in a sample tube while the tube is being rotated at high speed. After the application, an NMR signal is emitted from the sample and detected by the coil 37. The detection portion 51 is disposed in a given position within a vertical hole (bore) formed in a superconducting magnet (not shown).

The relay portion 52 is elongated to permit the detection portion 51 to be placed within the strong static magnetic field produced by the superconducting magnet.

The electric circuit portion 53 is located at the lower end of the relay portion 52 and incorporates a preamplifier 32 for amplifying the NMR signal detected by the transmit-receive coil 37 and a duplexer 31 for tuning and matching an external RF circuit (not shown) with the coil 37. The duplexer 31 is adapted to be operated in a low-temperature environment.

The refrigerant inlet/outlet portion 54 is used to introduce a refrigerant (liquid helium) for cryogenically cooling the transmit-receive coil 37 adapted to be operated at low temperatures, preamplifier 32, duplexer 31, tuning and matching variable capacitor 38, and other components into the NMR probe or to discharge the refrigerant from the probe.

The inside of the NMR probe is maintained in a vacuum of about $10^{-7}$ Torr at which thermal conduction of gas is not prevalent. Adjacent structural portions inside the probe are adiabatically isolated from each other by a vacuum layer. A wall for partitioning the vacuum layer from the outside air is made of glass-reinforced plastic.

The components are cooled in the manner as described below. First, the liquid helium of 4 K is injected into the NMR probe from a liquid helium injection port 39.

The injected helium is passed through a liquid helium transfer pipe 44 in the relay portion 52 and sent into a liquid helium reservoir (first heat exchanger) 36 in a top portion of the relay portion that is immediately under the detection portion.

When the liquid helium vaporizes in the helium reservoir 36, the helium takes away heat of vaporization and cools the transmit-receive coil 37 of the detection portion 51 and tuning and matching variable capacitor 38 in thermal contact with the helium reservoir 36 to below 10 K. Also, the helium cools the duplexer 31 and preamplifier 32 in the electric circuit portion 53 close to 45 K via the cold stage 34.

The vaporized, low-temperature helium gas passes through a helium gas return pipe 45 and is sent to a helium gas exit 40. The return pipe 45 coaxially surrounds the outer surface of the helium transfer pipe 44 of the relay portion 52 via a vacuum layer.

On its way to the helium gas exit, the returning helium gas cools the 50-K radiation shield 33 close to 45 K via the second heat exchanger 35. The radiation shield 33 is mounted to block radiation heat from the outside and tubularly surrounds the helium transfer pipe 44 and helium gas return pipe 45.

This prevents the transfer pipe 44 and cold stage 34 passing through the relay portion 52 from being warmed due to radiation heat from the outside.

The preamplifier 32 has an output terminal 41. The power amplifier has an input terminal 42. Indicated by 43 is a gaseous helium recovery port.

The duplexer 31 adapted for operation at low temperatures is characterized in that it is made of the crossed-diode pair 24 consisting of GaAs diodes which exhibit excellent RF characteristics at low temperatures and have high reverse voltage resistance. The GaAs diodes are crossed at zero bias to fabricate the crossed-diode pair 24. When large electric power is applied, the diode pair 24 is brought into conduction. When small electric power is applied, the diode pair 24 acts as an insulator. Therefore, it is possible to switch between large-power RF pulses from the power amplifier and small-power NMR signal from the NMR probe.

The transmission line extending from the output end A of the crossed-diode pair 24 to the input of the preamplifier is shifted in phase by 90° by the phase shifter 25-1 and shunted to earth ground by the crossed-diode pair 26. Thus, leakage of electric power to the preamplifier can be suppressed without affecting the matching of the whole circuit. Further shunting is done by a combination of 90° phase shifter 25-2 and crossed-diode pair 27 located behind the phase shifter 25-1. Consequently, leaking RF power can be reduced further. The preamplifier can be protected from leaking RF power.

Figure 5:
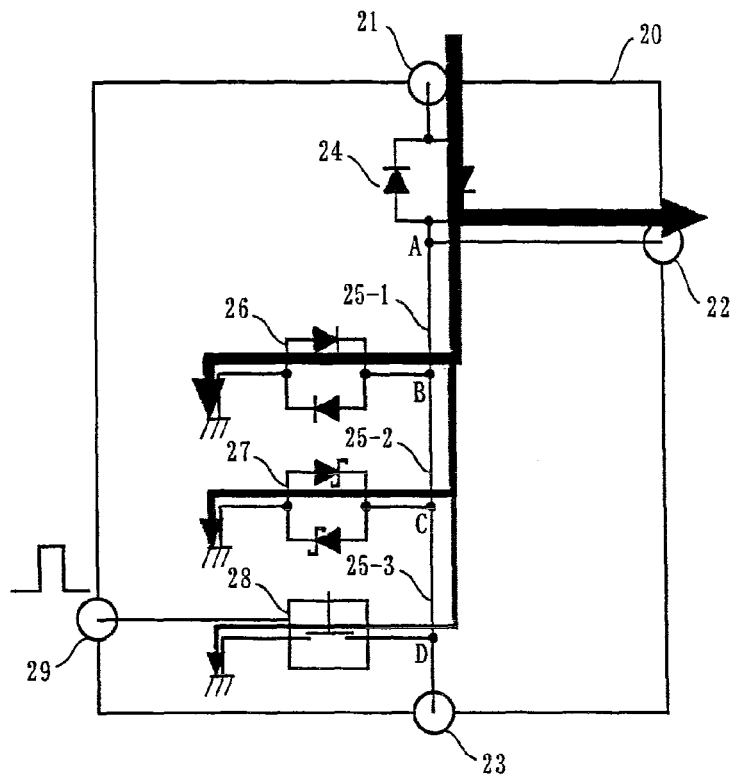
FIG. 5 is a circuit diagram of the inventive solid-state NMR probe using a cooled detection coil, and in which the probe operates in the transmit mode.
Figure 6:
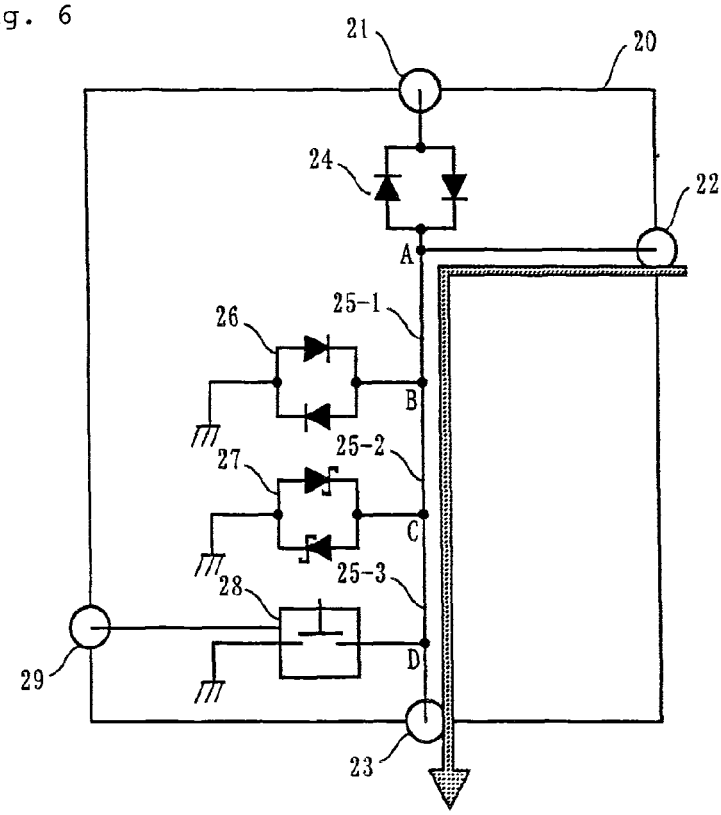
FIG. 6 is a circuit diagram similar to FIG. 5, but in which the probe operates in the receive mode.
Figure 7:
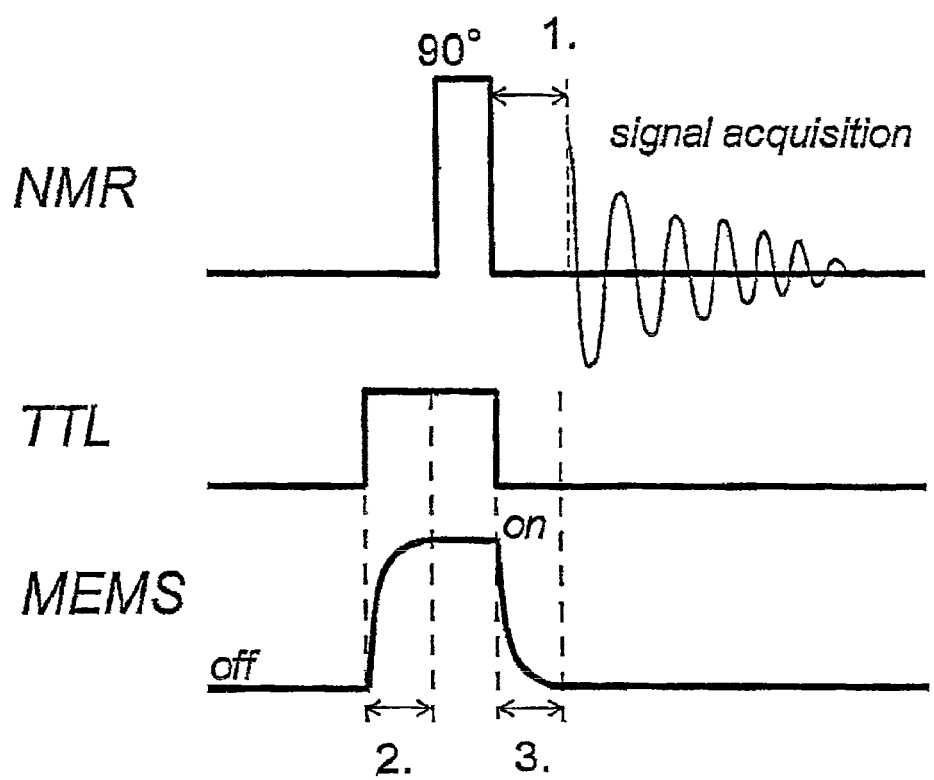
FIG. 7 is a waveform diagram illustrating the operation of the MEMS switch of the solid-state NMR probe associated with the present invention, the probe using a cooled detection coil.

The operation of the circuit is described in further detail by referring to FIGS. 5-7.

(1) When high-output RF radiation is applied as shown in FIG. 5, all the crossed-diodes are biased into conduction. The shunt RF-MEMS switch 28 is actively brought into conduction by an input signal from the switch activation terminal 29.

In particular, the impedance is maximal at the branch point A. At the point B, the impedance is minimal because the phase is shifted by 90° by the 90° phase shifter 25-1. Therefore, if the radiation is shunted by the crossed-diode pair 26 consisting of the GaAs PIN diodes, stationary waves are produced. Electric power can be transmitted with almost no loss to the NMR probe that is connected via the terminal 22.

However, the crossed diode pair consisting of the GaAs PIN diodes has finite resistance and so a part of the leaking RF power leaks to the preamplifier side. To reduce the RF power leaking to the preamplifier side, the power is shunted by the crossed-diode pair 27 made of GaAs Schottky barrier diodes at the point C where the impedance is minimal. At this point C, the phase is shifted by 90° by the next 90° phase shifter 25-2.

Furthermore, the crossed-diode pair 27 made of the GaAs Schottky barrier diodes has finite resistance although it is smaller than the resistance of the crossed diode pair made of the GaAs PIN diodes. Consequently, a small part of the leaking RF power leaks to the preamplifier side.

To reduce the weak RF power leaking to the preamplifier side, the radiation is shunted by the shunt RF-REMS switch 28 at a point D where the impedance is minimal. At this point D, the phase is shifted by 90° by the next 90° phase shifter 25-3. The leaking RF power is reduced sufficiently to protect the HEMT devices.

(2) When the magnetization of the sample is detected as shown in FIG. 6, the power level of the NMR signal is quite low. Therefore, all the crossed diodes 24, 26, and 27 are cut off and made insulative. The shunt MEMS switch 28 is actively made insulative by ceasing the input signal from the switch activation terminal.

When the application of the RF pulses from the power amplifier ends, magnetization excited in the sample induces a free induction decay within the observation plane. The decay is picked up as an induced electromotive force by the detection coil. The induced electromotive force (NMR signal) is transmitted to the input/output terminal 22 of the probe from a signal source consisting of the detection coil of the probe and enters the duplexer.

Note that the induced electromotive force is much smaller than the exciting RF pulsed power of more than 10 W and is on the microvolt order at most. Consequently, the induced electromotive force will not bring the crossed-diodes into conduction. Therefore, the signal will not travel toward the input terminal of the power amplifier nor pass through the crossed-diodes of the shunt or through the MEMS switch. As a result, the signal is transmitted to the output terminal 23 connected with the preamplifier with almost no loss. The signal can be acquired and amplified efficiently.

(3) Timing at which the MEMS switch is switched is described. The timing chart of FIG. 7 shows how the MEMS switch is switched when the duplexer associated with the present invention is operated as described in (1) and (2) above. PIN diodes and Schottky diodes have switching speeds of the order of picoseconds. However, MEMS switches have much slower switching speeds of less than 10 µs because mechanical action is involved.

Accordingly, prior to the application of RF pulses, a control signal TTL is produced from the logic output terminal of the spectrometer and stepped up via a DC amplifier. Then, the signal is sent to the MEMS switch control input terminal 29 (FIG. 3) of the duplexer. The pulse width of the control signal TTL needs to be greater than the experimentally obtained switching time (more than 10 µs; indicated by 2 in FIG. 7) of the MEMS. During the application of NMR RF pulses, the logic output TTL maintains the MEMS switch ON, thus protecting the preamplifier from inputting of excessively large RF pulses.

Simultaneously with the termination of outputting of NMR RF pulses, the control signal TTL is turned OFF. After a lapse of a given switching time (less than 10 µs; indicated by 3 in FIG. 7), the MEMS switch in the duplexer returns to its complete OFF state. The loss occurring in the interval between the input/output terminal 21 of the probe (FIG. 3) of the duplexer and the output terminal 23 (FIG. 3) connected with the preamplifier is suppressed to within 1 dB. The NMR signal can be transmitted to the preamplifier almost losslessly.

At this time, the switching time (indicated by 3 in FIG. 7) of the MEMS switch is shorter than the time (dead time of the spectrometer; indicated by 1 in FIG. 7) in which the transient response of the NMR spectrometer settles down.

Embodiment 2

The operation described in Embodiment 1 in connection with FIGS. 5 and 6 can also be accomplished by the following configuration.

Figure 8:
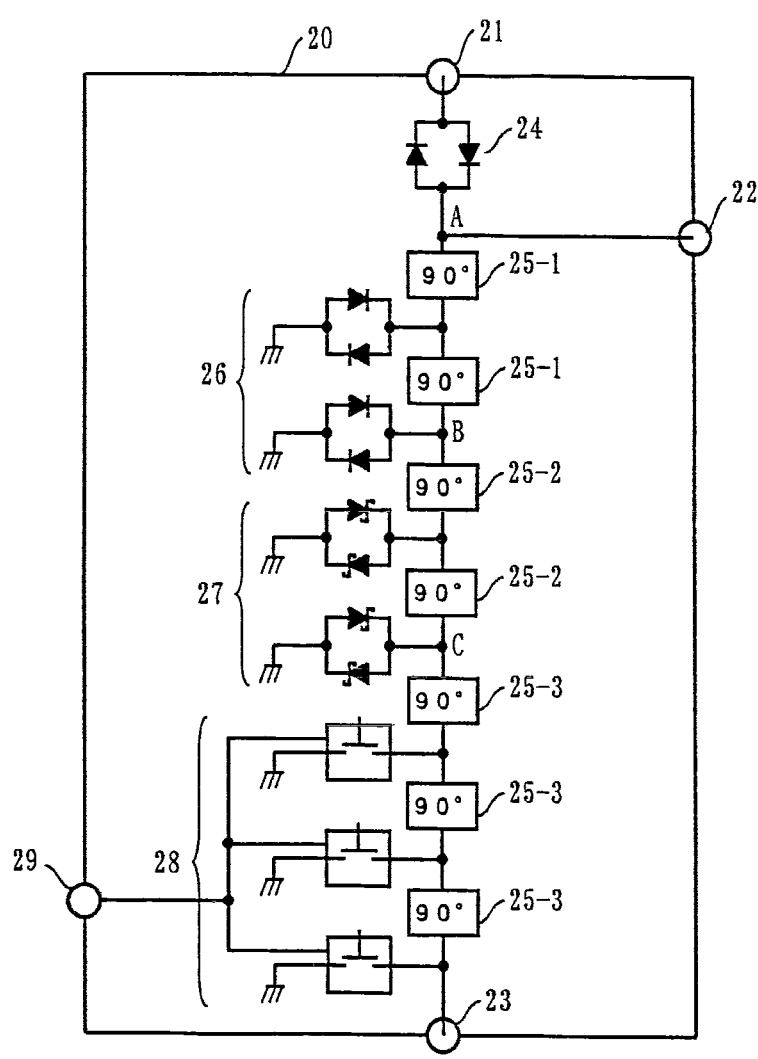
FIG. 8 is a circuit diagram of a cooled duplexer according to another embodiment of the invention.

FIG. 8 is a circuit diagram of a duplexer having plural stages of shunt gates of the structure shown in FIG. 3, the duplexer being adapted to be operated at low temperatures. A pair of crossed-diodes 24 is inserted in series with a line extending from the input terminal 21 connected with the power amplifier. The crossed-diode pair 24 has an output end A from which an input/output terminal 22 branches as a magnetization detection circuit. The terminal 22 is connected with the probe. A crossed-diode shunt circuit 26 is connected between the branch point A and the output terminal 23 connected with the preamplifier. The shunt circuit 26 is made up of plural stages (two stages in the illustrated example) of 90° phase shifters 25-1 (often replaced by LC circuits or coaxial cable) and GaAs PIN diodes. Another crossed-diode shunt circuit 27 made up of plural stages (two stages in the illustrated example) of 90° phase shifters 25-2 and GaAs Schottky barrier diodes is connected between the output end B and the output terminal 23 connected with the preamplifier. In addition, plural stages (three stages in this example) of 90° phase shifters 25-3 and shunt RF-MEMS switches 28 are connected between the output end C and the output terminal 23 connected with the preamplifier.

The present invention will find extensive use in solid-state NMR probes using cooled detection coils.

What is claimed is:

1. A transmit-receive switching circuit for use in an NMR spectrometer, the switching circuit being cooled during use to reduce thermal noise, the switching circuit comprising:
    a first terminal to which high-power RF pulses for observation are applied;
    a second terminal connected with an NMR detector for applying the RF pulses to a sample and for detecting an NMR signal from the sample;
    a third terminal for outputting the NMR signal to an external reception circuit;
    crossed-diodes permitting the RF pulses applied from the first terminal to be supplied to the second terminal;
    a transmission line permitting the NMR signal applied from the second terminal to be transmitted to the third terminal;
    plural stages of phase shifters inserted in the transmission line and connected in series with each other, the phase shifters acting to shift the RF pulses in phase by an angle given by (90°+180°×n) (where n is 0 or a natural number); and
    shunts connected between respective ones of the output ends of the plural stages of phase shifters and earth ground;
    wherein when the RF pulses for observation are applied to the first terminal, the crossed-diodes and the shunts are brought into conduction to supply the RF pulses from the first terminal to the NMR detector via the second terminal; and
    wherein when the NMR signal is entered from the second terminal after application of the RF pulses, the crossed-diodes and the shunts are cut off to supply the NMR signal from the second terminal to the third terminal.

2. A transmit-receive switching circuit for use in an NMR spectrometer as set forth in claim 1,
    wherein said shunts are arranged from the first terminal toward the third terminal,
    wherein the shunt located closest to the first terminal has maximum capability in withstanding high inputs, and
    wherein the shunt located closest to the third terminal has minimum leaking electric power.

3. A transmit-receive switching circuit for use in an NMR spectrometer as set forth in any one of claims 1 and 2, wherein said plural stages of phase shifters connected in series with each other include a first stage of phase shifter, and wherein the crossed-diodes made of GaAs PIN diodes are located as the shunt placed in a stage following the first stage of phase shifter.

4. A transmit-receive switching circuit for use in an NMR spectrometer as set forth in claim 3, wherein crossed-diodes made of GaAs Schottky barrier diodes are disposed as the shunt placed in a stage following the phase shifter that is placed in a stage following the stage in which the crossed-diodes made of the GaAs PIN diodes are placed.

5. A transmit-receive switching circuit for use in an NMR spectrometer as set forth in claim 4, wherein an RF-MEMS switch controlled to be ON when the RF pulses for observation are applied to the first terminal and to be OFF when the NMR signal is applied from the second terminal after the application of the RF pulses is disposed as the shunt placed in a stage following the phase shifter that is placed in a stage following the stage in which the crossed-diodes made of GaAs Schottky barrier diodes are placed.

6. A solid-state NMR spectrometer using a cooled detection coil, said solid-state NMR spectrometer incorporating a transmit-receive switching circuit for use in an NMR spectrometer as set forth in claim 1.

7. A solid-state NMR spectrometer using a cooled detection coil as set forth in claim 6, wherein said shunts are arranged from the first terminal toward the third terminal,
    wherein the shunt located closest to the first terminal has maximum capability in withstanding high inputs, and
    wherein the shunt located closest to the third terminal has minimum leaking electric power.

8. A solid-state NMR spectrometer using a cooled detection coil as set forth in claim 5, wherein said plural stages of phase shifters connected in series with each other include a first stage of phase shifter, and wherein the crossed-diodes made of the GaAs PIN diodes are located as the shunt placed in a stage following the first stage of phase shifter.

9. A solid-state NMR spectrometer using a cooled detection coil as set forth in claim 8, wherein crossed-diodes made of GaAs Schottky barrier diodes are disposed as the shunt placed in a stage following the phase shifter that is placed in a stage following the stage in which the crossed-diodes made of the GaAs PIN diodes are placed.

10. A solid-state NMR spectrometer using a cooled detection coil as set forth in claim 9, wherein an RF-MEMS switch controlled to be ON when the RF pulses for observation are applied to the first terminal and to be OFF when the NMR signal is applied from the second terminal after the application of the RF pulses is disposed as the shunt placed in a stage following the phase shifter that is placed in a stage following the stage in which the crossed-diodes made of the GaAs Schottky barrier diodes are placed.

* * * * *